(12) United States Patent
Campbell et al.

(10) Patent No.: US 8,824,143 B2
(45) Date of Patent: Sep. 2, 2014

(54) COMBINED POWER AND COOLING RACK SUPPORTING AN ELECTRONICS RACK(S)

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 13/271,262

(22) Filed: Oct. 12, 2011

(65) Prior Publication Data

US 2013/0094139 A1    Apr. 18, 2013

(51) Int. Cl.
*H05K 7/20*    (2006.01)
(52) U.S. Cl.
USPC ............................................ 361/699
(58) Field of Classification Search
None
See application file for complete search history.

(56) References Cited

U.S. PATENT DOCUMENTS

| | | | |
|---|---|---|---|
| 5,366,827 A * | 11/1994 | Belanger et al. | 429/99 |
| 6,657,320 B1 * | 12/2003 | Andrews et al. | 307/64 |
| 7,403,391 B2 * | 7/2008 | Germagian et al. | 361/695 |
| 7,511,960 B2 * | 3/2009 | Hillis et al. | 361/702 |
| 7,525,797 B2 * | 4/2009 | Coglitore et al. | 361/679.46 |
| 8,437,881 B2 * | 5/2013 | Sawczak et al. | 700/291 |
| 2004/0050231 A1 * | 3/2004 | Chu et al. | 83/574 |
| 2004/0168818 A1 * | 9/2004 | Layden et al. | 174/50 |
| 2005/0068728 A1 * | 3/2005 | Chu et al. | 361/690 |
| 2005/0122684 A1 * | 6/2005 | Chu et al. | 361/698 |
| 2005/0122685 A1 * | 6/2005 | Chu et al. | 361/699 |
| 2005/0128705 A1 * | 6/2005 | Chu et al. | 361/699 |

(Continued)

FOREIGN PATENT DOCUMENTS

| | | |
|---|---|---|
| EP | 1 986 076 A1 | 10/2008 |
| WO | WO 97/14918 A1 | 4/1997 |
| WO | WO 2010/093549 | 8/2010 |
| WO | WO 2011/009411 A1 | 1/2011 |

OTHER PUBLICATIONS

Campbell et al., Office Action for U.S. Appl. No. 13/692,177, filed Dec. 3, 2012 (U.S. Patent Publication No. 2013/0091706 AI), dated Oct. 30, 2013 (15 pages).

(Continued)

*Primary Examiner* — Adrian S Wilson
(74) *Attorney, Agent, or Firm* — Steven Chiu, Esq.; Kevin P. Radigan, Esq.; Heslin Rothenberg Farley & Mesiti P.C.

(57) ABSTRACT

A combined power and cooling apparatus is provided facilitating powering and cooling one or more electronics racks, which are distinct from the power and cooling apparatus. The power and cooling apparatus includes a frame, one or more bulk power assemblies associated with the frame, and one or more heat exchange assemblies associated with the frame. The one or more bulk power assemblies are configured to provide power to the one or more electronics racks, and the one or more heat exchange assemblies are configured to cool system coolant provided to the one or more electronics racks. Heat is transferred by the one or more heat exchange assemblies from the system coolant to a facility coolant. In operation, the power and cooling apparatus is coupled to provide both power and cooling to the one or more electronics racks.

18 Claims, 13 Drawing Sheets

(56) References Cited

U.S. PATENT DOCUMENTS

| | | | |
|---|---|---|---|
| 2006/0126293 A1* | 6/2006 | Campbell et al. | 361/699 |
| 2007/0121295 A1* | 5/2007 | Campbell et al. | 361/699 |
| 2008/0002364 A1* | 1/2008 | Campbell et al. | 361/699 |
| 2008/0084664 A1* | 4/2008 | Campbell et al. | 361/699 |
| 2008/0084667 A1* | 4/2008 | Campbell et al. | 361/702 |
| 2008/0084668 A1* | 4/2008 | Campbell et al. | 361/702 |
| 2008/0165499 A1* | 7/2008 | Campbell et al. | 361/699 |
| 2008/0273307 A1* | 11/2008 | Campbell et al. | 361/699 |
| 2008/0291626 A1* | 11/2008 | Nelson et al. | 361/696 |
| 2008/0310104 A1* | 12/2008 | Campbell et al. | 361/690 |
| 2009/0122487 A1* | 5/2009 | Campbell et al. | 361/698 |
| 2009/0129000 A1* | 5/2009 | Hoeft et al. | 361/679.01 |
| 2009/0150129 A1* | 6/2009 | Archibald et al. | 703/5 |
| 2009/0157333 A1* | 6/2009 | Corrado et al. | 702/61 |
| 2010/0002393 A1* | 1/2010 | Campbell et al. | 361/699 |
| 2010/0287018 A1* | 11/2010 | Shrivastava et al. | 705/8 |
| 2010/0319883 A1* | 12/2010 | Facusse | 165/104.26 |
| 2011/0060470 A1* | 3/2011 | Campbell et al. | 700/282 |
| 2011/0217916 A1* | 9/2011 | De Zen et al. | 454/184 |
| 2011/0307729 A1* | 12/2011 | Matsuzawa et al. | 713/323 |
| 2012/0204051 A1* | 8/2012 | Murakami et al. | 713/324 |
| 2013/0091706 A1 | 4/2013 | Campbell et al. | |

OTHER PUBLICATIONS

Campbell et al., Office Action for U.S. Appl. No. 13/692,177, filed Dec. 3, 2012 (U.S. Patent Publication No. 2013/0091706 A1), dated Apr. 21, 2014 (11 pages).

* cited by examiner

COMBINED POWER AND COOLING RACK SUPPORTING AN ELECTRONICS RACK(S)

BACKGROUND

The present invention relates in general to apparatuses and methods for facilitating operation of liquid-cooled, rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both the module and system levels. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolants.

BRIEF SUMMARY

In one aspect, provided herein is an apparatus which includes: a frame; at least one bulk power assembly; and at least one heat exchange assembly. The at least one bulk power assembly is associated with the frame, and is configured to provide power to at least one electronics rack, wherein the apparatus is distinct from the at least one electronics rack. The at least one heat exchange assembly is associated with the frame, and is configured to cool system coolant provided to the at least one electronics rack to facilitate cooling of the at least one electronics rack, wherein heat is transferred by the at least one heat exchange assembly from the system coolant to a facility coolant, and wherein the apparatus provides both power and cooling to the at least one electronics rack.

In another aspect, a data center is provided which includes at least one electronics rack comprising at least one electronic subsystem to be powered and cooled, and a power and cooling apparatus for powering and cooling the at least one electronics rack. The power and cooling apparatus is distinct from the at least one electronics rack, and includes: a frame; at least one bulk power assembly associated with the frame and configured to provide power to the at least one electronics rack; and at least one heat exchange assembly associated with the frame and configured to cool system coolant provided to the at least one electronics rack, wherein heat is transferred by the at least one heat exchange assembly from the system coolant to a facility coolant, and wherein the power and cooling apparatus provides both power and cooling to the at least one electronics rack.

In a further aspect, a method of providing an apparatus for facilitating powering and cooling of at least one electronics rack is provided. The method includes: providing a frame; associating at least one bulk power assembly with the frame, the at least one bulk power assembly being configured to provide power to the at least one electronics rack, wherein the frame with the associated at least one bulk power assembly are distinct from the at least one electronics rack; and associating at least one heat exchange assembly with the frame, the at least one heat exchange assembly being configured to cool system coolant provided to the at least one electronics rack, wherein heat is transferred by the at least one heat exchange assembly from the system coolant to a facility coolant, and wherein the frame with the associated at least one bulk power assembly and associated at least one heat exchange assembly provides both power and cooling to the at least one electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
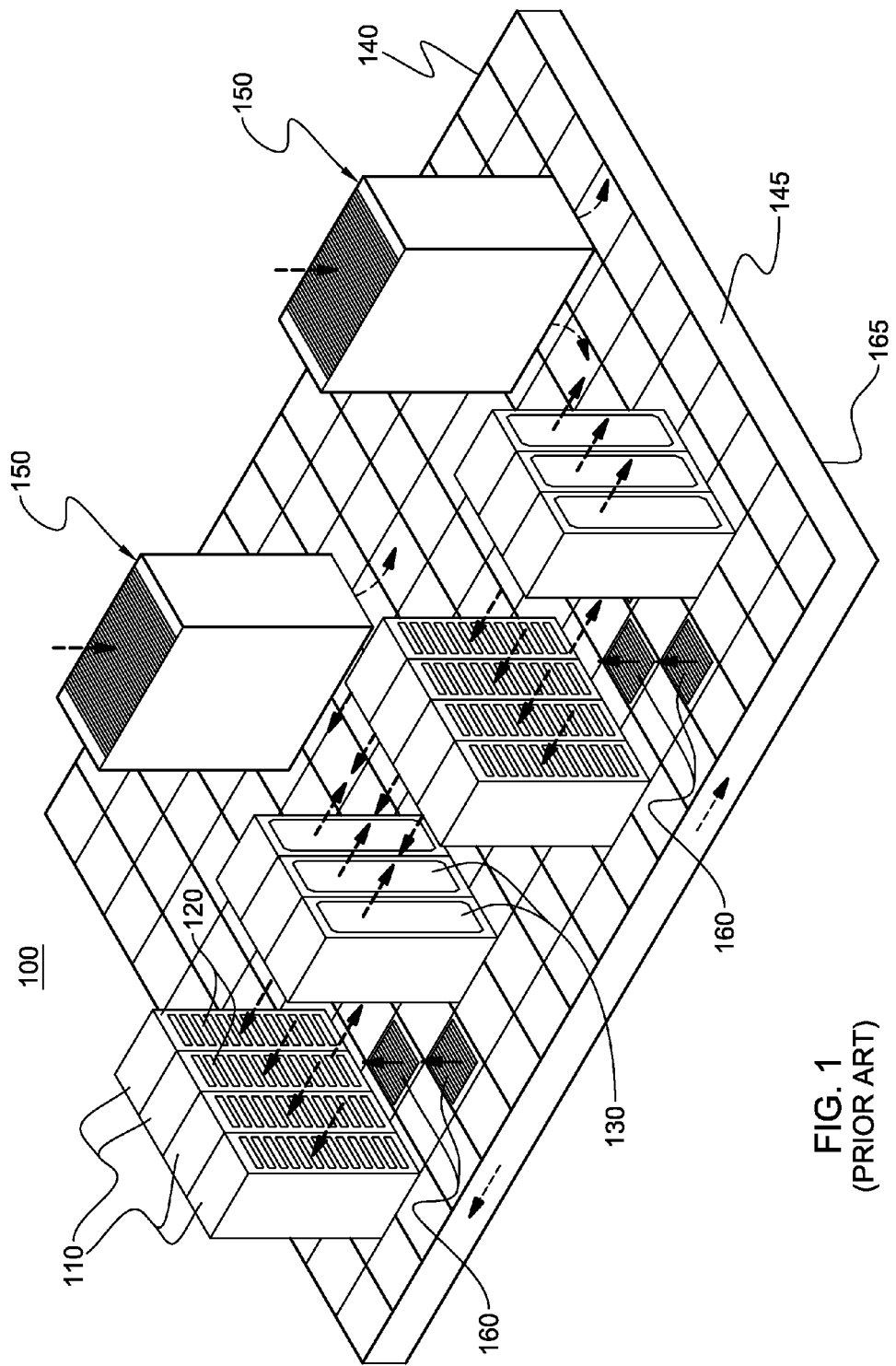
FIG. 1 depicts one embodiment of a conventional raised floor layout of an air-cooled data center.

As used herein, the terms "electronics rack", and "rack-mounted electronic equipment" are used interchangeably, and unless otherwise specified include any housing, frame, rack, compartment, blade server system, etc., having one or more heat-generating components of a computer system or electronics system, and may be, for example, a stand-alone computer processor having high, mid or low end processing capability. In one embodiment, an electronics rack may comprise multiple electronic subsystems, each having one or more heat-generating components disposed therein requiring cooling. "Electronic subsystem" refers to any sub-housing, blade, book, drawer, node, compartment, etc., of an electronics rack having one or more heat-generating electronic components disposed therein. Each electronic subsystem of an electronics rack may be movable or fixed relative to the electronics rack, with the rack-mounted electronics drawers of a multi-drawer rack unit and blades of a blade center system being two examples of subsystems of an electronics rack to be cooled. In one specific example, each electronic subsystem comprises a server node of a multi-server rack.

"Electronic component" refers to any heat-generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, an electronic component may comprise one or more bare dies or one or more packaged dies disposed on a common carrier. As used herein, "primary heat-generating component" refers to a primary heat-generating electronic component within an electronic subsystem, while "secondary heat-generating component" refers to an electronic component of the electronic subsystem generating less heat than the primary heat-generating component to be cooled. Further, unless otherwise specified herein, the term "liquid-cooled cold plate" refers to any conventional thermally conductive structure having one or more channels or passageways formed therein for flowing of liquid coolant therethrough. In addition, "metallurgically bonded" refers generally herein to two components being welded, brazed or soldered together by any means.

As used herein, "liquid-to-air heat exchanger" means any heat exchange mechanism characterized as described herein through which liquid coolant can circulate; and includes, one or more discrete liquid-to-air heat exchange mechanisms coupled either in series or in parallel. A liquid-to-air heat exchanger may comprise, for example, one or more coolant flow paths, formed of thermally conductive tubing (such as copper or other tubing) in thermal or mechanical contact with a plurality of air-cooled cooling fins. Size, configuration and construction of the liquid-to-air heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of a liquid coolant (for example, the facility or system coolants discussed below) is water. However, the concepts disclosed herein are readily adapted to use with other types of coolant. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, cooled air enters the data center via perforated floor tiles 160 from a cool air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the data center. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Due to the ever-increasing airflow requirements through electronics racks, and the limits of air distribution within the typical data center installation, liquid-assisted cooling is being combined with the conventional air-cooling. FIGS. 2-6 illustrate one embodiment of a data center implementation employing a liquid-assisted cooling system with one or more cold plates coupled to high heat-generating electronic components disposed within the electronics racks.

Figure 2:
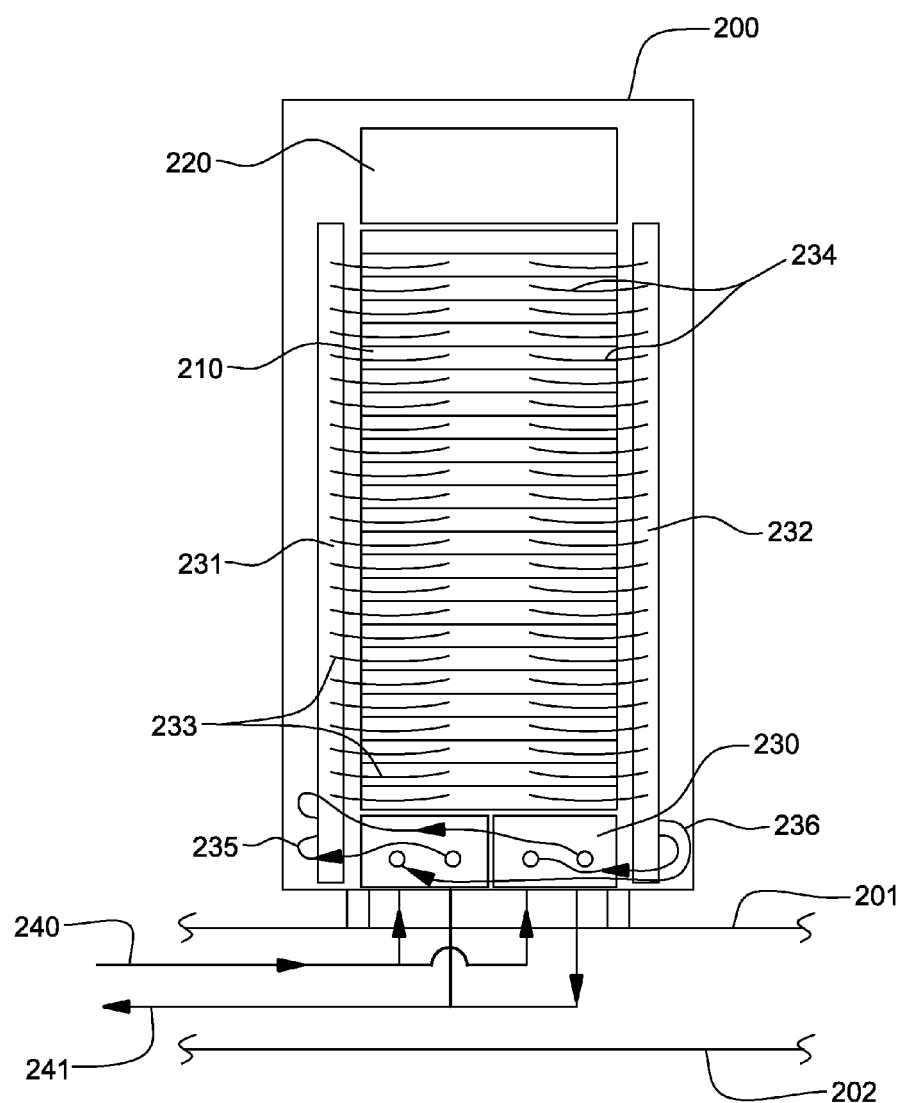
FIG. 2 is a front elevational view of one embodiment of an at least partially liquid-cooled electronics rack comprising multiple electronic subsystems, in accordance with one or more aspects of the present invention.

FIG. 2 depicts one embodiment of a partially liquid-cooled electronics rack 200. As illustrated, liquid-cooled electronics rack 200 comprises a plurality of electronic subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In the embodiments described herein, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronic subsystems 210, and node-to-manifold fluid connect hoses 234 coupling the individual electronic subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronic subsystems is transferred from the system water to cooler facility water supplied by facility water supply line 240 and facility water return line 241 disposed, in the illustrated embodiment, in the space between a raised floor 201 and a base floor 202.

Figure 3:
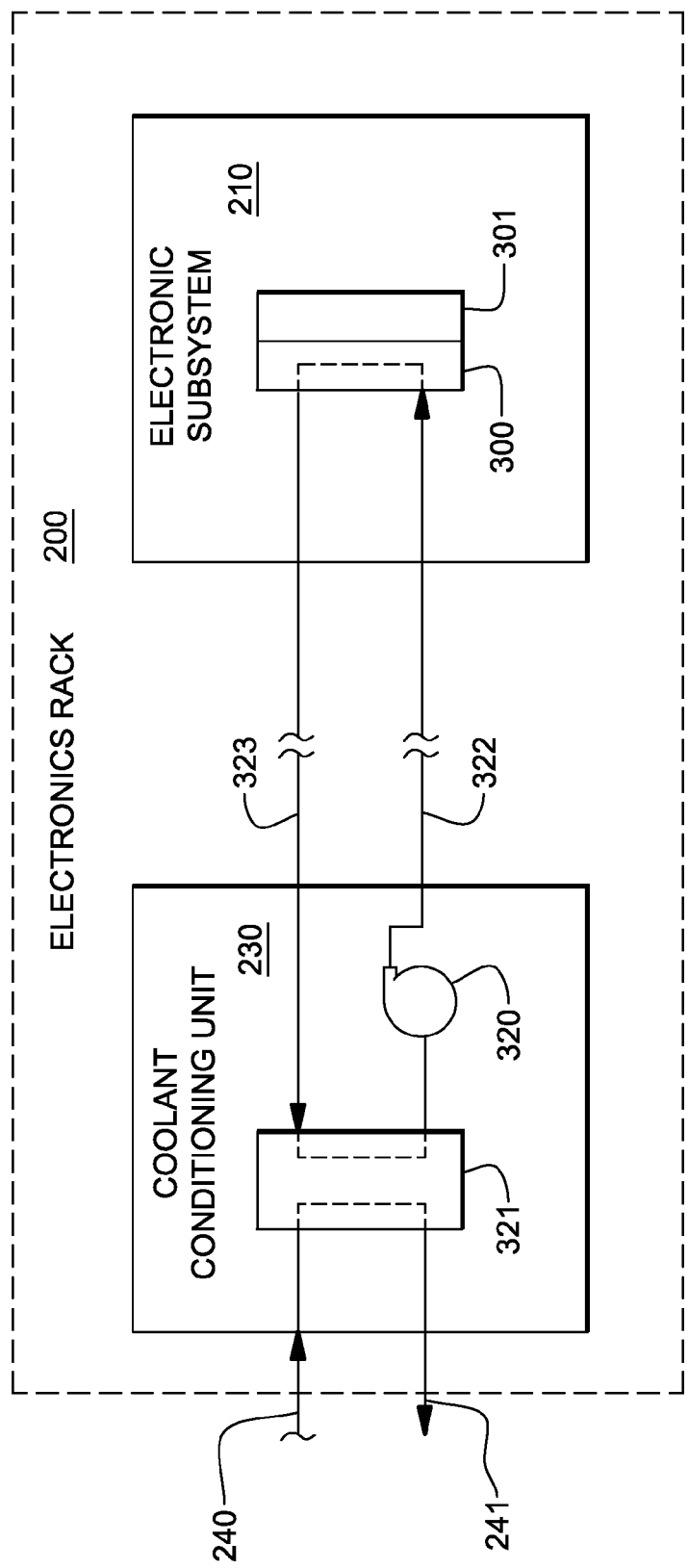
FIG. 3 is a schematic of one embodiment of an electronics rack, wherein an electronic module (or component) is liquid-cooled by system coolant (provided by one or more coolant conditioning units disposed within the electronics rack) passing through a liquid-cooled structure coupled to the electronic module, in accordance with one or more aspects of the present invention.

FIG. 3 schematically illustrates operation of the cooling system of FIG. 2, wherein a liquid-cooled cold plate 300 is shown coupled to an electronic module 301 of an electronic subsystem 210 within the liquid-cooled electronics rack 200. Heat is removed from electronic module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronic module(s). Furthermore, the system coolant is physically separate from the less controlled facility coolant in lines 240, 241, to which heat is ultimately transferred.

Figure 4:
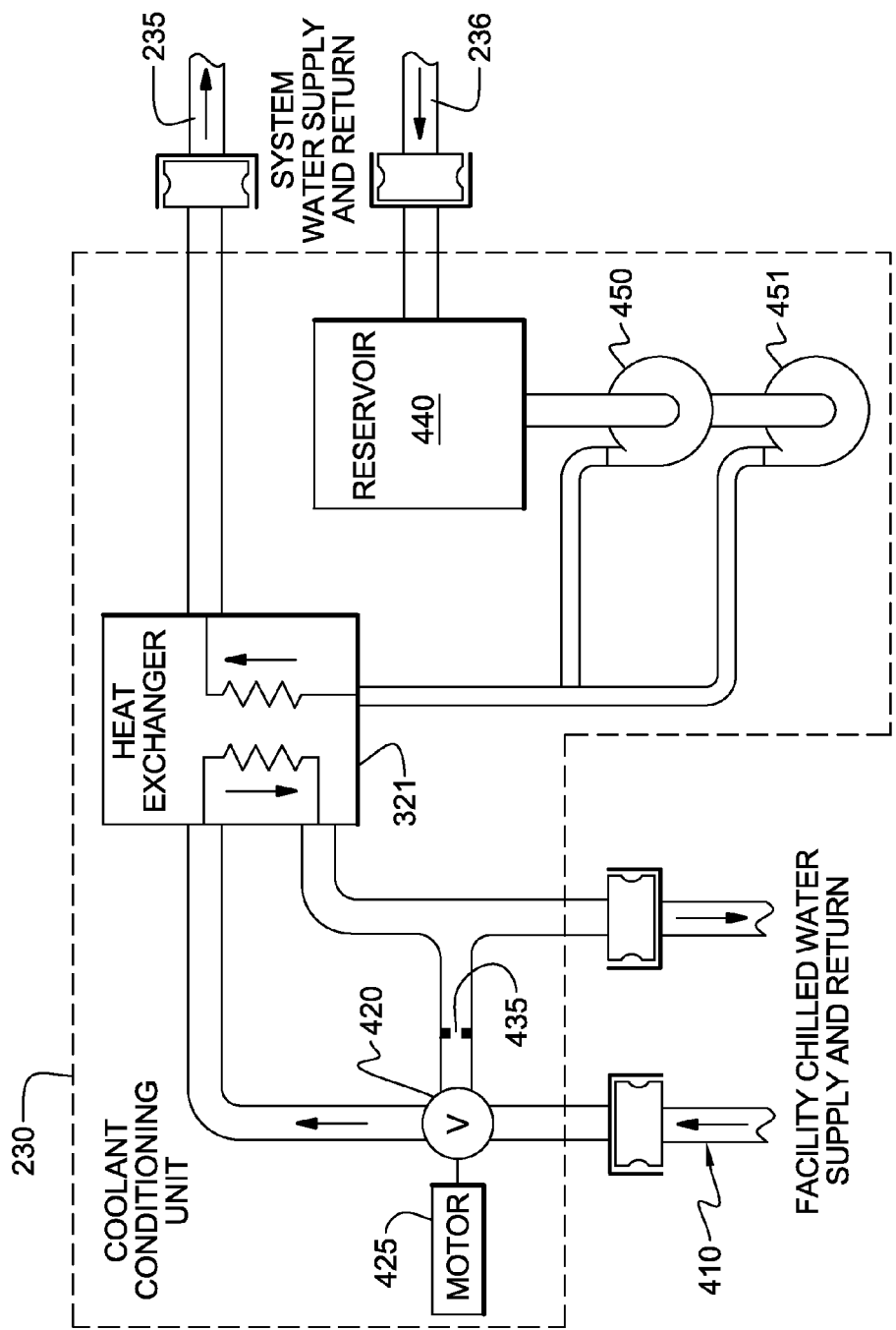
FIG. 4 is a schematic of one embodiment of a coolant conditioning unit disposed within a liquid-cooled electronics rack, in accordance with one or more aspects of the present invention.

FIG. 4 depicts a more detailed embodiment of a coolant conditioning unit 230. As shown in FIG. 4, coolant conditioning unit 230 includes a first coolant loop wherein chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second coolant loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and system water return manifold of the liquid-cooled electronics rack via the system water supply hose 235 and system water return hose 236.

Figure 5:
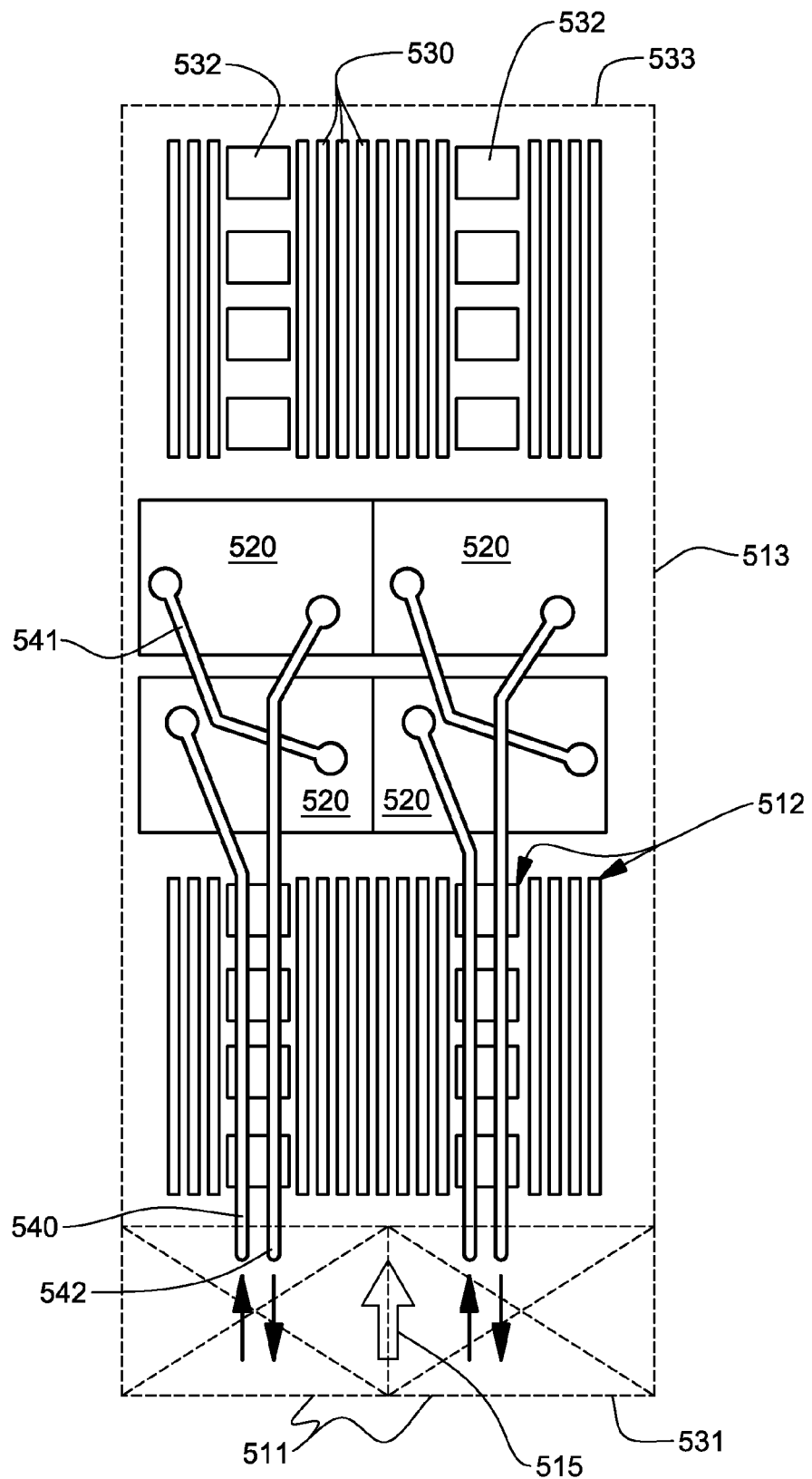
FIG. 5 is a plan view of one embodiment of an electronic subsystem layout illustrating an air and liquid cooling system for cooling components of the electronic subsystem, in accordance with one or more aspects of the present invention.

FIG. 5 depicts one embodiment of an electronic subsystem 513 component layout wherein one or more air moving devices 511 provide forced air flow 515 to cool multiple components 512 within electronic subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronic subsystem 513, and partially arrayed near back 533 of electronic subsystem 513. Also, in the embodiment of FIG. 5, memory modules 530 and the memory support modules 532 are cooled by air flow 515 across the electronic subsystem.

The illustrated liquid-based cooling system further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
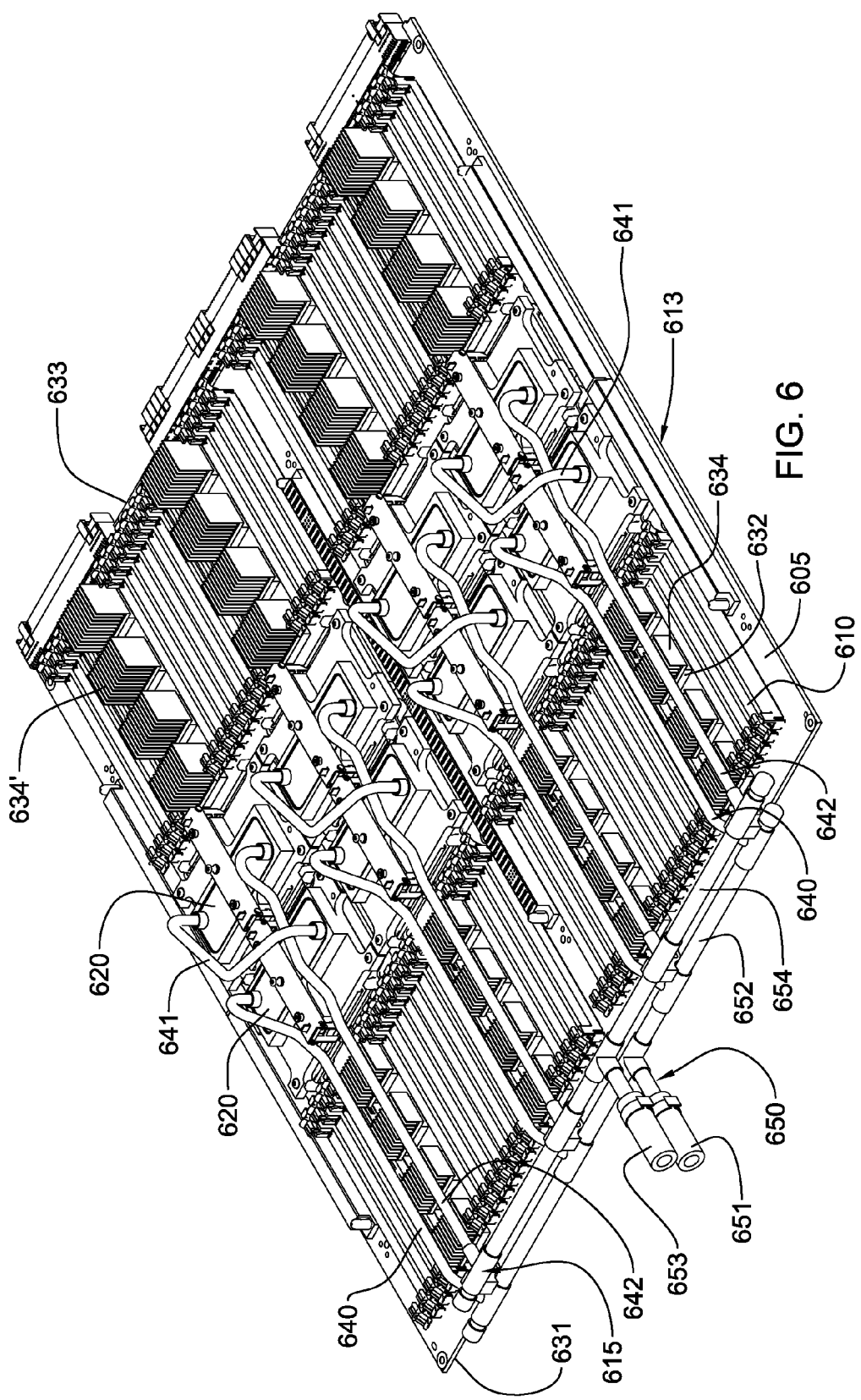
FIG. 6 depicts one detailed embodiment of a partially-assembled electronic subsystem layout, wherein the electronic subsystem includes eight heat-generating electronics components to be actively cooled, each having a respective liquid-cooled structure of a liquid-based cooling system coupled thereto, in accordance with one or more aspects of the present invention.

FIG. 6 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat-generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronic system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet a given customer's specifications.

Thus, presented herein in one aspect is a robust liquid-assisted cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 6 depicts a partially assembled electronic system 613 and an assembled liquid-based cooling system 615 coupled to primary heat-generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the liquid-cooled cold plates 620 of the liquid-based cooling system 615.

In addition to liquid-cooled cold plates 620, liquid-based cooling system 615 includes multiple coolant-carrying tubes, including coolant supply tubes 640 and coolant return tubes 642 in fluid communication with respective liquid-cooled cold plates 620. The coolant-carrying tubes 640, 642 are also connected to a header (or manifold) subassembly 650 which facilitates distribution of liquid coolant to the coolant supply tubes and return of liquid coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Liquid-based cooling system 615 comprises a pre-configured monolithic structure which includes multiple (pre-assembled) liquid-cooled cold plates 620 configured and disposed in spaced relation to engage respective heat-generating electronic components. Each liquid-cooled cold plate 620 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two liquid manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 642. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described liquid cooling approach of FIGS. 2-6 is an effective solution for circulating water through liquid-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, are disposed within each electronics rack. As explained above, heat load carried by the system coolant circulating through the liquid-cooled components in the liquid-cooled electronics rack is rejected to facility chilled water passing through the second coolant path through the active water-to-water heat exchangers within the coolant conditioning units disposed within the rack units.

Figure 7:
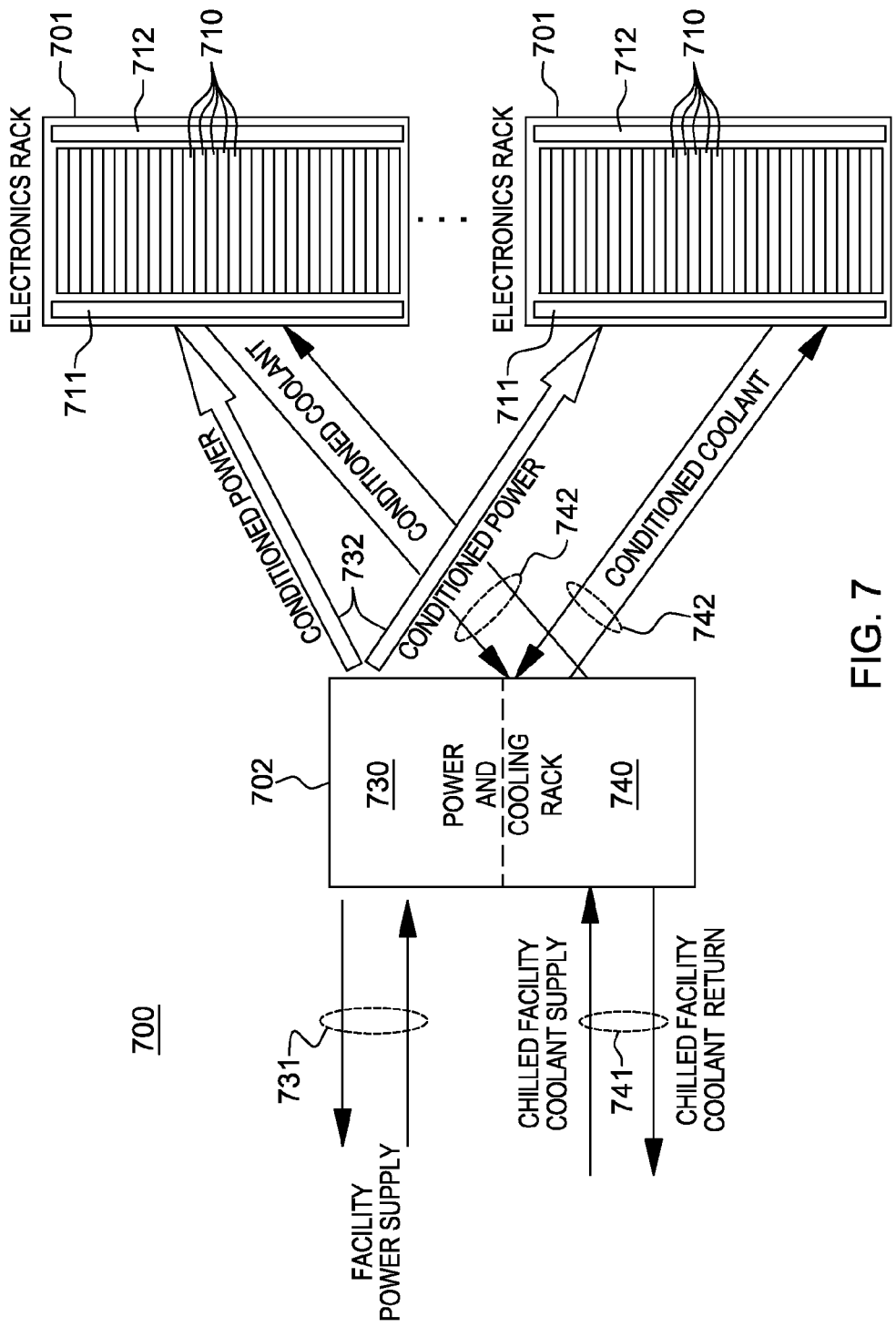
FIG. 7 depicts one embodiment of a data center comprising multiple electronics racks powered and cooled by a power and cooling rack or apparatus, in accordance with one or more aspects of the present invention.
Figure 8A:
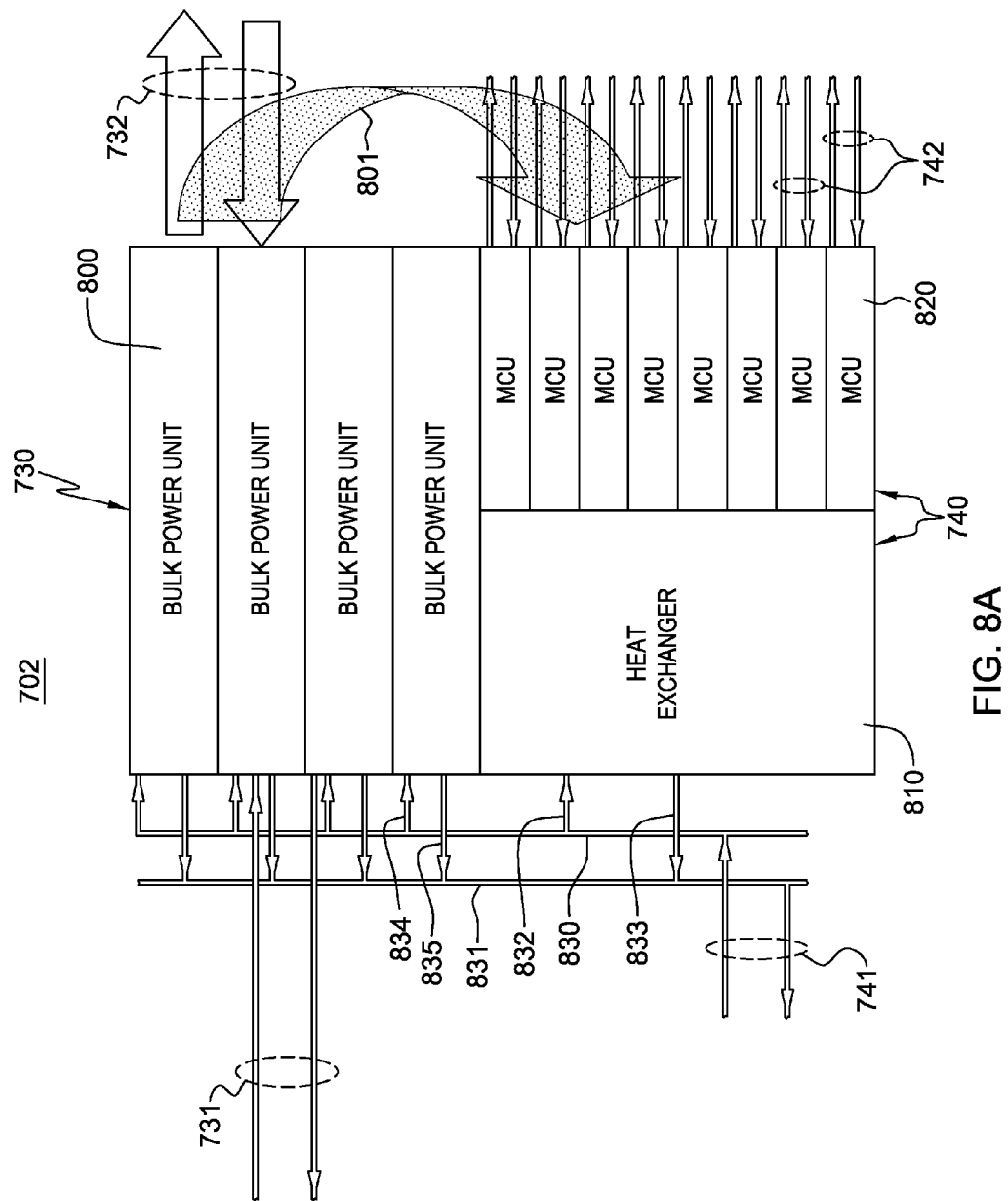
FIG. 8A depicts one embodiment of a power and cooling rack, in accordance with one or more aspects of the present invention.
Figure 8B:
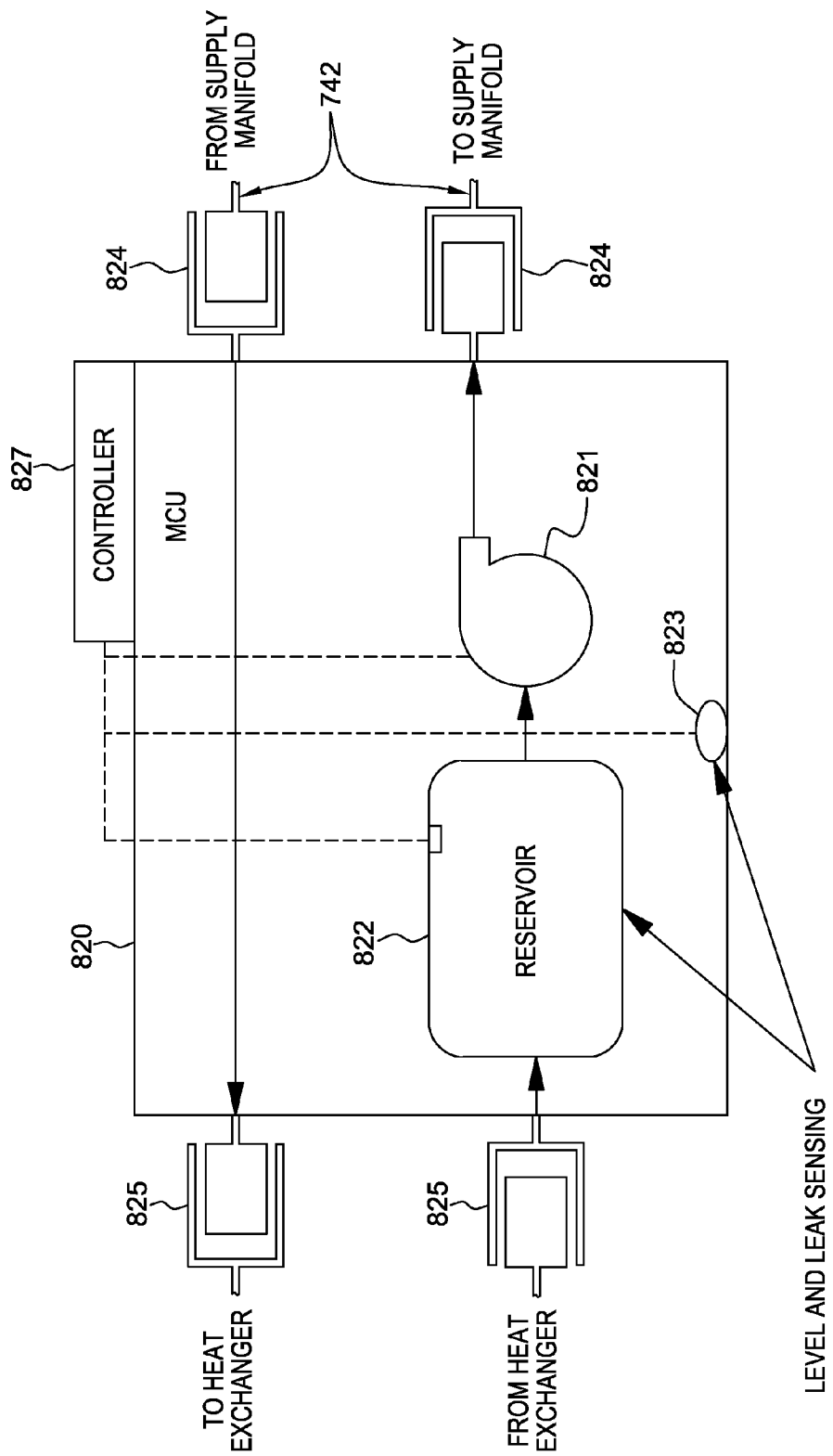
FIG. 8B depicts one embodiment of a modular cooling unit for the power and cooling rack of FIG. 8A, in accordance with one or more aspects of the present invention.
Figure 8C:
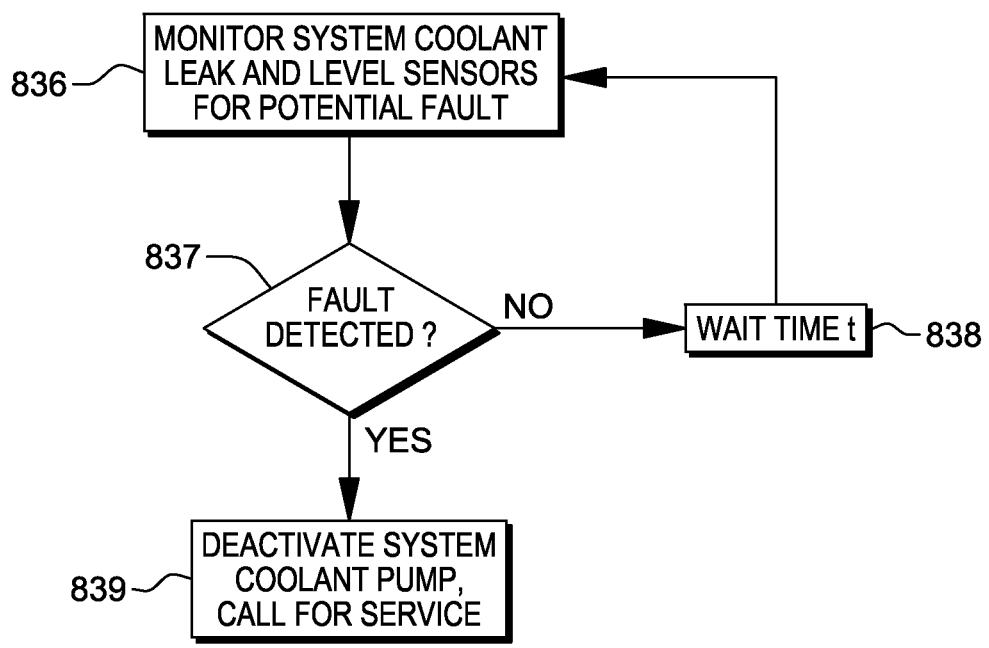
FIG. 8C is a flowchart of one process embodiment for controlling operation of the system coolant pump of the modular cooling unit of FIG. 8B, in accordance with one or more aspects of the present invention.
Figure 8D:
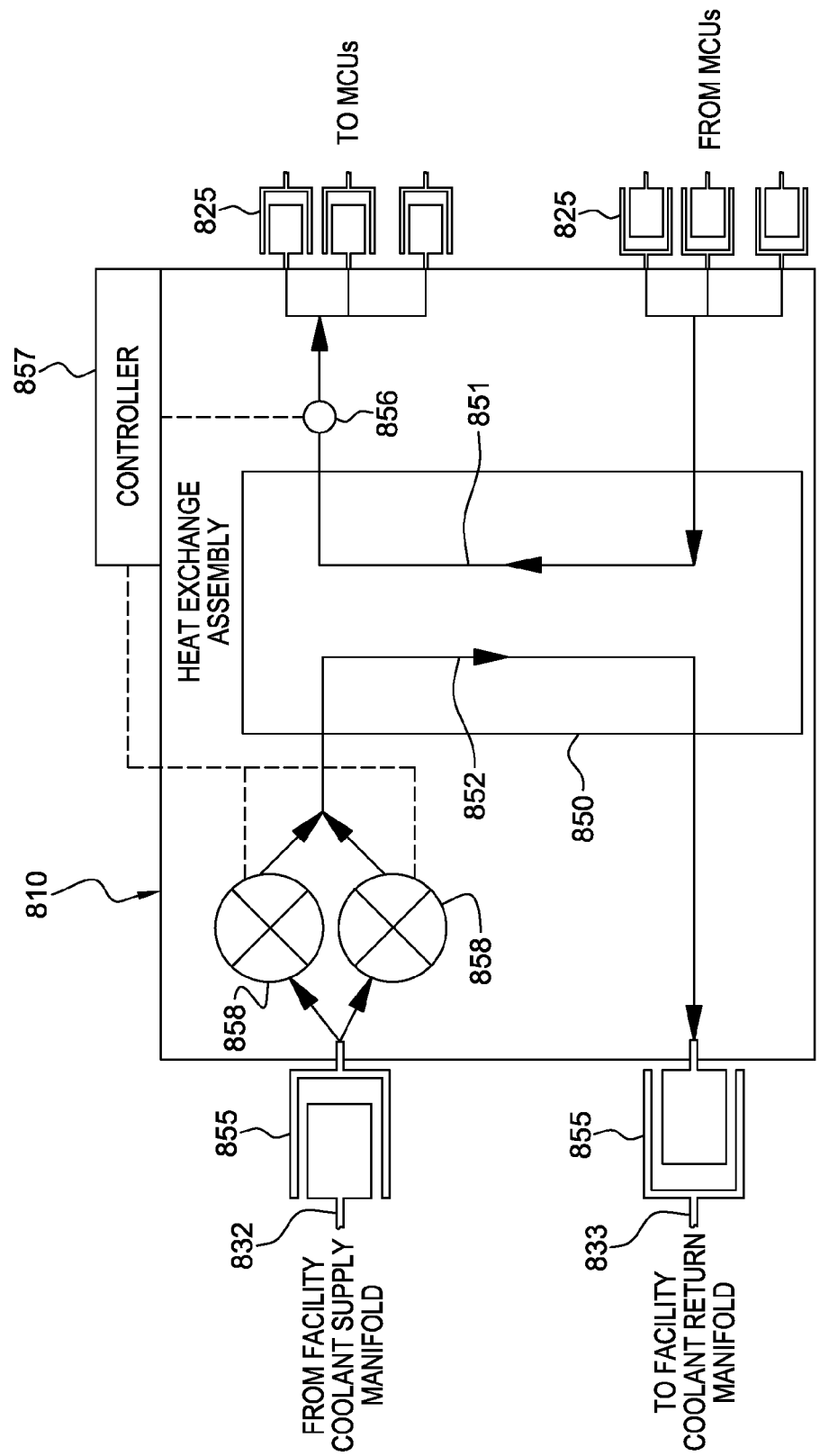
FIG. 8D depicts one embodiment of a heat exchange assembly for the power and cooling rack of FIG. 8A, in accordance with one or more aspects of the present invention.
Figure 8E:
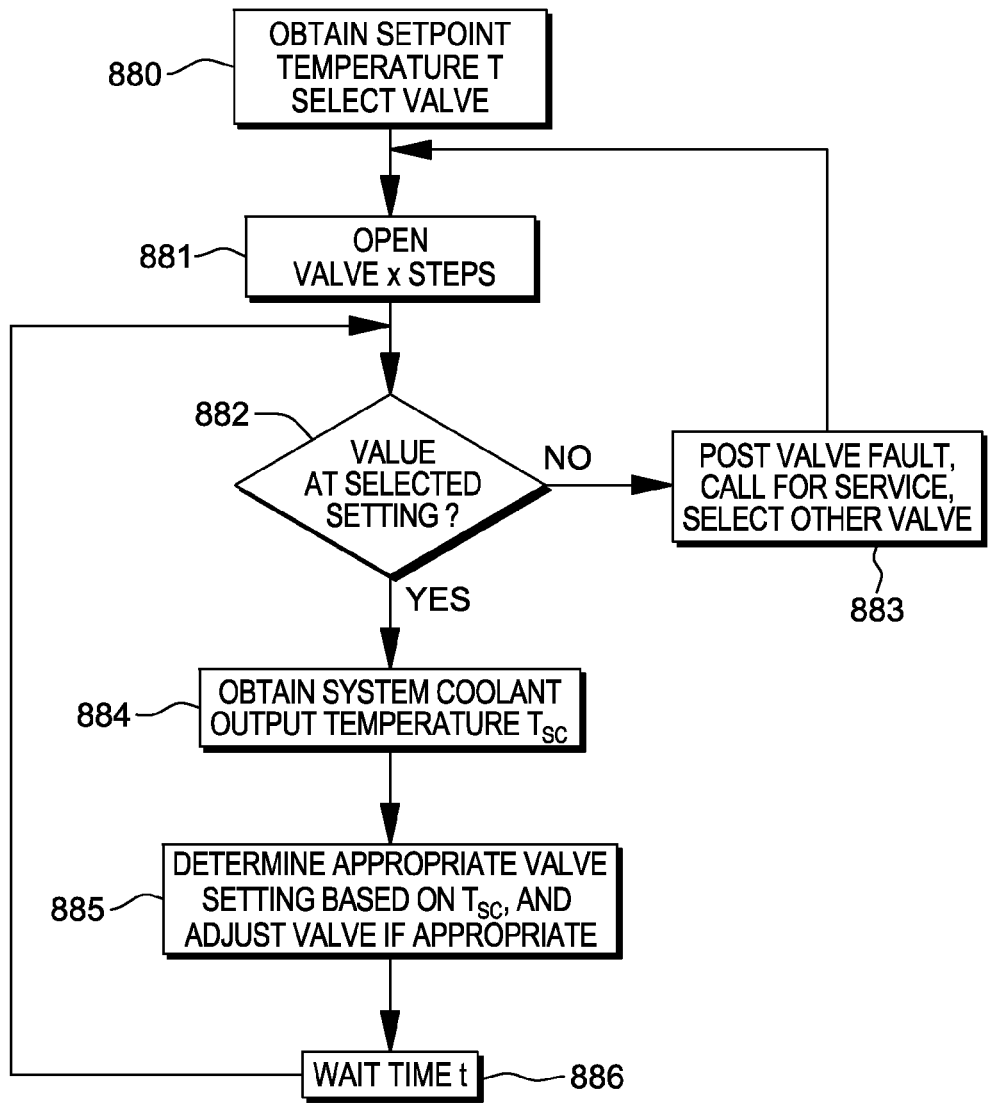
FIG. 8E is a flowchart of one process embodiment for controlling flow of facility coolant through the heat exchange assembly of FIG. 8D, in accordance with one or more aspects of the present invention.
Figure 8F:
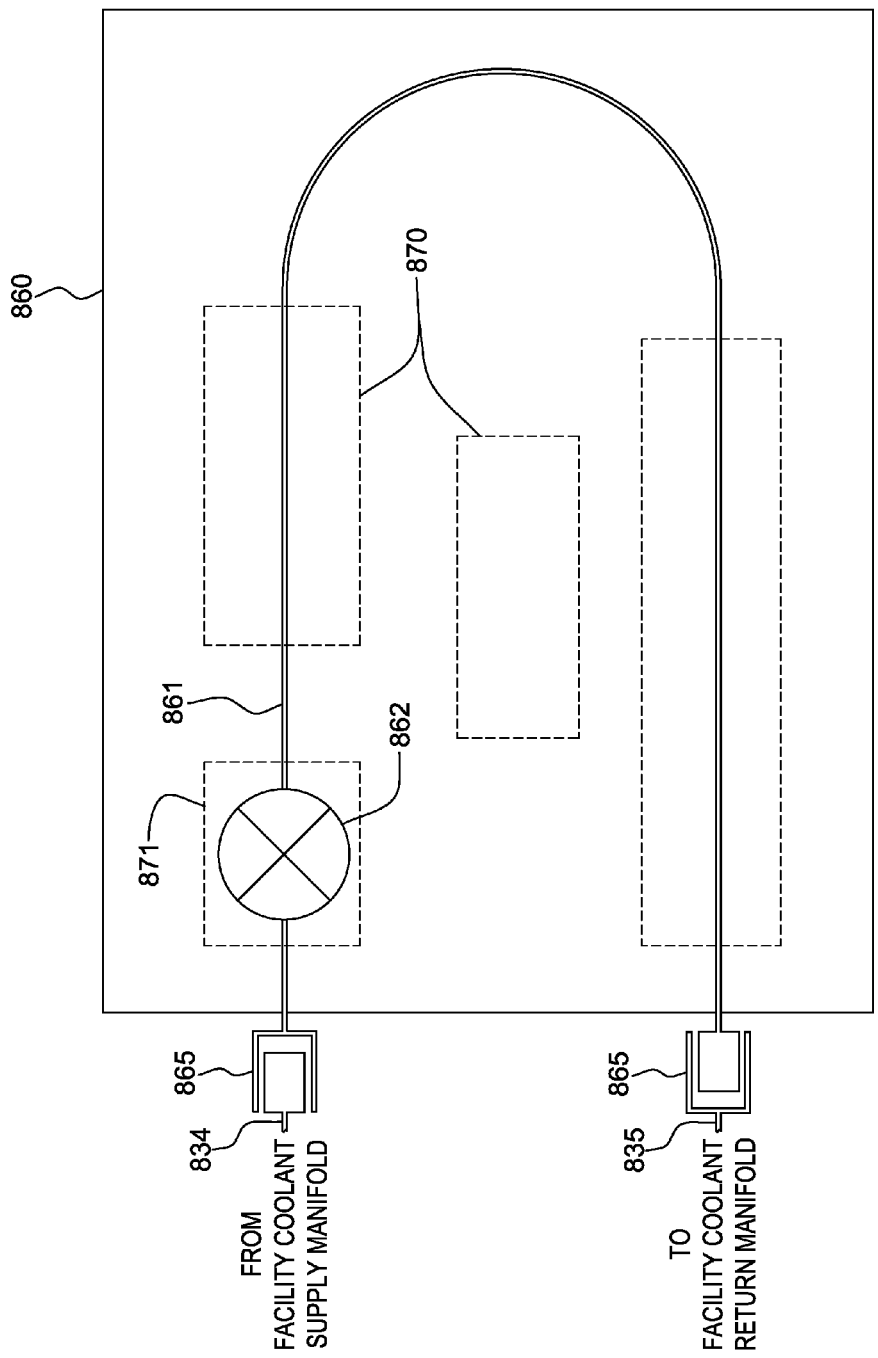
FIG. 8F is a plan view of one embodiment of a facility coolant-cooled cold plate coupled to a bulk power assembly of the power and cooling rack of FIG. 8A, in accordance with one or more aspects of the present invention.

FIGS. 7-8F depict another aspect of the present invention. Current high-performance computing systems can consume, for example, 250 kW of energy per electronics rack. This energy is dissipated in heat, which poses significant challenges to both the rack-level power and cooling systems. As noted, to achieve high-performance and high-density, manufacturers use liquid cooling to enable significant performance and component density increases. With the increasing demands for electrical power and cooling architecture, however, more of the available electronics rack volume is needed to house the power and cooling components, limiting the space available for the electronic subsystems (e.g., the computing elements, such as server units). Further, component redundancy, which ensures availability and reliability of the overall system, dictates that multiple (i.e., redundant) power and cooling devices exist within each electronics rack to service the computing elements in the event of a primary system failure.

Responsive to these issues, disclosed herein is a combined, power and cooling apparatus or rack which includes a frame, at least one bulk power assembly associated with the frame, and at least one heat exchange assembly associated with the frame. The bulk power assembly(ies) is configured to provide power to one or more electronics racks, wherein the power and cooling rack is distinct (e.g., separate) from the electronics rack(s) to be powered and cooled. The one or more heat exchange assemblies are configured to cool system coolant provided to the electronics rack(s), wherein heat is transferred by the at least one heat exchange assembly from the system coolant to a facility coolant. Thus, the combined power and cooling apparatus (or rack) provides both power and cooling to one or more distinct electronics racks. By offloading the power and cooling componentry to a dedicated, combined power and cooling rack, space is made available within the one or more electronics racks powered and cooled by the combined power and cooling rack to accommodate additional electronic subsystems, such as additional server units.

More particularly, disclosed herein in one aspect is a modular, redundant, scalable power and cooling supply rack, designed to service two or more electronics racks of up to 500 kW each. Raw AC or DC electricity and facility coolant (e.g., building chilled water) are supplied to the power and cooling rack, which in turn supplies the bulk power to the computing device inputs of the electronics racks at, for example, 350 V DC, and cooled system coolant to the electronics racks as well. Redundancy (n+1) is achieved for two or more electronics racks, rather than for a single electronics rack, thereby advantageously reducing the required number of redundant components associated with the power and cooling of the electronics racks.

FIG. 7 depicts one embodiment of a data center, generally denoted 700, comprising two or more electronics racks 701 and a power and cooling rack 702, in accordance with one or more aspects of the present invention. In this embodiment, each electronics rack 701 includes a plurality of electronic subsystems 710, which are liquid-cooled via a system coolant, for example, passing through one or more liquid-cooled cold plates disposed within the electronic subsystems (or server units). In the embodiment illustrated, each electronics rack 701 includes a system coolant supply manifold 711 and a system coolant return manifold 712, which facilitate the distribution of system coolant received via a respective system coolant loop 742, coupled between the electronics rack 701 and at least one heat exchange assembly 740 of the combined power and cooling rack 702. Additionally, combined power and cooling rack 702 includes at least one bulk power assembly 730, which (in one embodiment) comprises an AC-to-DC power supply assembly, coupled to an AC power supply line 731 and configured to provide conditioned, DC power via distribution cables 732 to the electronics racks 701.

In one specific example, a three-phase AC source feeds power via AC power supply line 731 to the bulk power assembly(ies) 730, which transforms the supplied AC power to an appropriate DC power level for output via the respective power distribution cables 732 to the plurality of electronics racks 701, and in particular, to the plurality of electronic subsystems within the electronics racks. AC power supply line 731 supplies (in one example) three phases for international voltage(s).

The number of electronic subsystems installed in an electronics rack 701 is variable and depends, for example, on customer requirements for a particular system. Further, the number of bulk power units within a given bulk power assembly 730 of the AC-to-DC power supply assembly is also variable; and is determined (in one implementation) by the number of electronic subsystems installed in the electronics racks to be powered by the combined power and cooling rack. More particularly, the number of bulk power units (including regulators) within a given bulk power assembly can be determined by the power requirements of the common load of the electronics rack(s) fed by the particular bulk power assembly.

Advantageously, data center 700 depicted in FIG. 7 has a larger volume available within each electronics rack 701 for compute elements, such as server units, and a smaller overall footprint volume due to the consolidation of the power and cooling components for multiple electronics racks within a common rack. For example, the coolant conditioning units, such as described above in connection with FIGS. 2-4, employ at the frame level one heat exchanger per coolant-conditioning unit, and there would typically be two coolant-conditioning units per electronics rack. This is contrasted with the data center depicted in FIG. 7, wherein (in one embodiment) the heat exchange assembly comprises a single, large heat exchanger.

FIG. 8A depicts a more detailed embodiment of a power and cooling rack 702. In this embodiment, the bulk power assembly 730 is shown to comprise four bulk power units 800, and the heat exchange assembly 740 is shown to comprise a single heat exchanger 810, and a plurality of modular cooling units (MCUs) 820. By way of example, each bulk power unit 800 may comprise one or more bulk power regulators as needed to provide the desired power to one or more electronics racks powered by the combined power and cooling apparatus.

As described below with reference to FIG. 8D, heat exchanger 810 includes a liquid-to-liquid heat exchanger 850 coupled to facility coolant loop 741 via a facility coolant supply manifold 830 and a facility coolant return manifold 831. Additionally, the one or more system coolant loops 742 are coupled in fluid communication with the heat exchanger 810 via the one or more modular cooling units 820. In this embodiment, eight modular cooling units are depicted, by way of example only. In one embodiment, four modular cooling units may be dedicated to a particular electronics rack of the plurality of electronics racks serviced by the combined power and cooling rack 702 to provide redundancy to the system coolant cooling. For example, two modular cooling units of four modular cooling units providing system coolant to a system coolant manifold (see FIG. 7) associated with a particular electronics rack may be active at one time, with the remaining modular cooling units offline being as backup to the primary modular cooling units.

Note with reference to the embodiment of FIG. 8A, that the bulk power assembly 730 also provides conditioned power 801 to the modular cooling units 820, and that the facility coolant supply manifold 830 and facility coolant return manifold 831 provide facility coolant in parallel to the heat exchanger 810 (via a facility coolant inlet line 832 and outlet line 833), as well as to, for example, one or more cold plates associated with the bulk power assembly 730 via respective facility coolant sub-loops, each comprising a facility coolant supply line 834 and a facility coolant return line 835. As explained further below, the facility coolant advantageously directly cools one or more components of the bulk power assembly(ies), which ensures that cooling capability is available even when the combined power and cooling rack is in standby mode (i.e., a low-power, energy conservation mode) and, for example, the modular cooling unit's system coolant pumps are deactivated. As noted, the bulk power assembly(ies) provide (in one embodiment) conditioned, DC power to the electronics racks, as well as to the modular cooling units and the heat exchange assembly. The heat exchange assembly cools the system coolant, which is then pumped by the modular cooling units to the electronics racks being serviced by the combined power and cooling rack 702 for use at the electronics racks to cool one or more electronic components thereof, for example, as described above in connection with FIGS. 2-6.

FIG. 8B depicts one embodiment of a modular cooling unit 820, in accordance with an aspect of the present invention. In this embodiment, modular cooling unit 820 includes a system coolant pump 821, a system coolant reservoir 822, and a coolant leak sensor 823 located, for example, in a lower portion of modular cooling unit 820. A controller 827 associated with modular cooling unit 820, or disposed separately from the modular cooling unit (for example, in the bulk power assembly) senses, for example, system coolant level within system coolant reservoir 822, as well as monitors leak detector 823. The controller 827 is coupled to system coolant pump 821 to, for example, control activation or deactivation of the pump. As illustrated, quick connect couplings 824 facilitate connecting modular cooling unit 820 to the respective system coolant loop 742. System coolant loop 742 couples the modular cooling unit to the respective electronics rack, that is, to the rack-level system coolant supply and return manifolds described above with reference to, for example, FIGS. 2 & 7. The modular cooling unit 820 further includes quick connect couplings 825 coupling the cooling unit to, for example, the liquid-to-liquid heat exchanger of the heat exchange assembly 810 (see FIG. 8D). By way of example, the quick connect couplings referenced herein may comprise various types of commercially available couplings, such as those available from Colder Products Company, of St. Paul, Minn., U.S.A., or Parker Hannifin, of Cleveland, Ohio, U.S.A.

In operation, controller 827 monitors the system coolant reservoir level sensor(s) and leak sensor(s), interprets the sensors, and controls activation or deactivation of system coolant pump 821, and/or controls motor speed of the system coolant pump 821, for example, dependent on a level of system coolant within system coolant reservoir 822.

FIG. 8C depicts one embodiment of a control process which may be implemented by controller 827. In this process, the controller monitors system coolant leak and level sensors for a potential fault 836, and determines whether a fault is detected 837. If "no", processing waits time "t" 838 before again checking the leak and level sensors for a potential fault 836. Responsive to a fault being detected, the controller deactivates the system coolant pump, and initiates a call for service 839.

FIG. 8D depicts one embodiment of heat exchanger 810. As illustrated, heat exchanger 810 includes a liquid-to-liquid heat exchanger 850, with a system coolant path 851 and a facility coolant path 852 through the liquid-to-liquid heat exchanger 850. System coolant path 851 is coupled (via respective quick connects 825) in fluid communication with the aggregated flow of system coolant through the MCUs and the system coolant loops (see FIG. 8A), and facility coolant path 852 is coupled in fluid communication with facility coolant supply line 832 and facility coolant return line 833 via respective quick connects 855. As illustrated, a controller 857 is coupled to one or more thermal sensors 856 for sensing, for example, temperature of system coolant exiting the heat exchange assembly, as well as to (in the depicted embodiment) redundant control valves 858 in fluid communication with facility coolant inlet line 832 to the heat exchanger 810. Controller 857 and controller 827 (see FIG. 8B) of the modular cooling units may be the same controller or different controllers. Further, controller 857 could be implemented within heat exchange assembly 810 or, for example, remotely within (for example) the combined power and cooling rack, such as within the bulk power assembly(ies). Each of the redundant control valves 858 may be a fail-closed valve, and in one embodiment, only one control valve 858 is open at a time to allow the flow of facility coolant therethrough.

As one specific operational example, liquid-to-liquid heat exchanger 850 receives facility coolant metered by one or more control valves 858. The facility coolant passes through one side of the liquid-to-liquid heat exchanger, and then returns to the facility coolant loop of the data center. The control valve 858 is configured (in one embodiment) to close under spring force, such that a failure of the control valve (or its power or control function) results in a closed valve. The second redundant control valve is in parallel with the first control valve to ensure reliable operation in the event of a valve failure. The other side of the liquid-to-liquid heat exchanger receives system coolant from the multiple modular cooling units. A set of redundant temperature sensors 856 is employed for monitoring temperature of the system coolant being supplied to the electronics racks, which may be used, for example, to adjust flow of facility coolant through the liquid-to-liquid heat exchanger via control valve(s) 858, as explained further below with reference to FIG. 8E.

FIG. 8E depicts one process embodiment for controlling facility coolant flow through the liquid-to-liquid heat exchanger responsive to monitored temperature of system coolant being output (via the MCUs) to the system coolant loops coupled to the electronics racks. A set point temperature T is obtained, and one of the redundant valves 858 is selected 880. The valve is opened by, for example, x steps 881, determined, for example, with reference to the selected set point temperature and (for example) the anticipated temperature of facility coolant provided to the heat exchange assembly. Processing determines via valve feedback whether the valve is at the selected setting 882. If "no", a valve fault is posted, and the controller calls for servicing of the valve. The other valve is selected 883, and processing then opens the other valve at the selected x steps. Assuming that the valve has been opened by the desired amount, then processing obtains system coolant output temperature ($T_{SC}$) 884, and determines an appropriate valve setting based on the sensed temperature ($T_{SC}$) 885. For example, a feedback control mechanism, such as proportional integral differential processing, could be employed at this step to determine the desired valve setting based on the sensed system coolant temperature. If appropriate, the valve setting is adjusted. Processing then waits a time "t" 886, before repeating the process.

FIG. 8F depicts one embodiment of bulk power assembly cooling, in accordance with an aspect of the present invention. As illustrated, in the depicted embodiment, a facility-cooled cold plate 860 is disposed in thermal contact with (e.g., over) one or more electronic components 870 of a bulk power unit of the bulk power assembly. A facility coolant sub-loop 861 (e.g., comprising one or more coolant-carrying channels extending through the cold plate) is associated with the facility-cooled cold plate 860 and is therefore in thermal contact with the electronic components 870 of the respective bulk power unit of the bulk power assembly. Quick connect couplings 865 may be employed coupling the facility coolant sub-loop 861 to the respective facility coolant inlet line 834 and facility coolant outlet line 835, which as noted above, are in fluid communication with the facility coolant supply manifold and facility coolant return manifold of the combined power and cooling rack.

One or more thermostats 862 are provided in series fluid communication with the facility coolant sub-loop 861 and in thermal contact with one or more respective heat-generating electronic components 871 of the bulk power unit being cooled. As component temperature increases, the thermostat valve is configured and disposed to automatically open proportionately, allowing increased facility coolant flow through the facility coolant sub-loop 861. (By way of example, the one or more thermostats 862 may comprise any of a variety of commercially available thermostats, such as a Danfoss FJVA series reverse acting thermostatic valve, offered by Danfoss of Baltimore, Md., USA.) The facility coolant flows through the facility coolant sub-loop, including one or more passages in the liquid-cooled cold plate 860, absorbing heat from the components, and carrying the heat out to the facility coolant return manifold, and hence, to the facility coolant loop.

In operation, the bulk power units of the bulk power assembly supply conditioned power to one or more electronics racks of the data center, as well as to the MCUs of the heat exchange assembly. In a minimum power, standby state, the MCUs do not pump system coolant, since the electronics racks do not require cooling in this state, as no (or minimal) computing work is being performed, and the bulk power units are converting only enough electrical power to maintain network communications, which can be used to wake the system. In standby state, the only cooling necessary for the power and cooling rack is in the bulk power units of the bulk power assembly. This cooling is provided by the facility coolant directly (i.e., without use of system coolant), since the one or more thermostats associated with the facility coolant sub-loop(s) may operate independently, allowing, for example, the thermostat valve to open as the associated electronic component temperature increases.

As will be appreciated by one skilled in the art, control aspects of the present invention may be embodied as a system, method or computer program product. Accordingly, control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible, non-transitory medium that can contain or store a program for use by or in connection with an instruction execution system, apparatus, or device.

In one example, a computer program product includes, for instance, one or more computer readable storage media to store computer readable program code means or logic thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. An apparatus comprising:
a frame;

at least one bulk power assembly associated with the frame, and configured to provide power to at least one electronics rack, wherein the apparatus is distinct from the at least one electronics rack;

at least one heat exchange assembly associated with the frame and configured to cool system coolant provided to the at least one electronics rack, wherein heat is transferred by the at least one heat exchange assembly from the system coolant to a facility coolant, and wherein the apparatus provides both power and cooling to the at least one electronics rack; and at least one facility coolant sub-loop and at least one facility coolant-cooled cold plate, the at least one facility coolant sub-loop being coupled in fluid connection with the at least one facility coolant-cooled cold plate, and the at least one facility coolant-cooled cold plate is disposed in thermal conductive contact with at least one heat-generating component of the at least one bulk power assembly, the at least one facility coolant sub-loop and at least one facility coolant-cooled cold plate facilitating transfer of heat from the at least one heat-generating component of the at least one bulk power assembly directly to the facility coolant.

2. The apparatus of claim 1, wherein the at least one bulk power assembly is configured to provide power to multiple electronics racks, the apparatus being distinct from the multiple electronics racks, and the at least one heat exchange assembly is configured to cool system coolant provided to the multiple electronics racks by transferring heat from the system coolant to the facility coolant.

3. The apparatus of claim 1, wherein the at least one heat exchange assembly comprises at least one liquid-to-liquid heat exchanger across which heat is transferred from the system coolant to the facility coolant.

4. The apparatus of claim 3, further comprising at least one adjustable valve in fluid communication with the at least one liquid-to-liquid heat exchanger for controlling flow of facility coolant through the at least one liquid-to-liquid heat exchanger, and a controller controlling the at least one adjustable valve based on a sensed temperature of the system coolant.

5. The apparatus of claim 3, further comprising at least one modular cooling unit coupled in fluid communication with at least one system coolant loop, the at least one system coolant loop facilitating transfer of system coolant between the at least one liquid-to-liquid heat exchanger and the at least one electronics rack, each modular cooling unit of the at least one modular cooling unit comprising a system coolant pump and a system coolant reservoir, the system coolant pump facilitating circulation of system coolant within the at least one system coolant loop between the at least one liquid-to-liquid heat exchanger and the at least one electronics rack.

6. The apparatus of claim 5, wherein the at least one bulk power assembly is electrically connected to power the at least one system coolant pump of the at least one modular cooling unit.

7. The apparatus of claim 5, further comprising a controller controlling the at least one system coolant pump based, at least in part, on a level of system coolant in the system coolant reservoir.

8. The apparatus of claim 1, further comprising at least one thermostat in thermal contact with the at least one heat-generating component of the at least one bulk power assembly, the at least one thermostat being configured and disposed to automatically adjust facility coolant flow through the at least one facility coolant sub-loop based on a temperature of the at least one heat-generating component.

9. The apparatus of claim 8, further comprising at least one cold plate coupled to the at least one heat-generating component of the at least one bulk power assembly, the at least one facility coolant sub-loop being in thermal contact with the at least one cold plate.

10. The apparatus of claim 8, further comprising a facility coolant supply manifold and a facility coolant return manifold coupled to facilitate flow of facility coolant in parallel to the at least one heat exchange assembly and the at least one facility coolant sub-loop associated with the at least one bulk power assembly.

11. A data center comprising:

at least one electronics rack comprising at least one electronic subsystem to be powered and cooled; and a power and cooling apparatus for powering and cooling the at least one electronics rack, the power and cooling apparatus being distinct from the at least one electronics rack, and comprising:

a frame;

at least one bulk power assembly associated with the frame, and configured to provide power to the at least one electronics rack;

at least one heat exchange assembly associated with the frame and configured to cool system coolant provided to the at least one electronics rack, wherein heat is transferred by the at least one heat exchange assembly from the system coolant to a facility coolant, and wherein the power and cooling apparatus provides both power and cooling to the at least one electronics rack; and at least one facility coolant sub-loop and at least one facility coolant-cooled cold plate, the at least one facility coolant sub-loop being coupled in fluid connection with the at least one facility coolant-cooled cold plate, and the at least one facility coolant-cooled cold plate is disposed in thermal conductive contact with at least one heat-generating component of the at least one bulk power assembly, the at least one facility coolant sub-loop and at least one facility coolant-cooled cold plate facilitating transfer of heat from the at least one heat-generating component of the at least one bulk power assembly directly to the facility coolant.

12. The data center of claim 11, wherein the data center comprises multiple electronics racks, and wherein the at least one bulk power assembly is configured to provide power to the multiple electronics racks, and the at least one heat exchange assembly is configured to cool system coolant provided to the multiple electronics racks by transferring heat from the system coolant to the facility coolant.

13. The data center of claim 11, wherein at least one heat exchange assembly comprises at least one liquid-to-liquid heat exchanger across which heat is transferred from the system coolant to the facility coolant, and wherein the power and cooling apparatus further comprises at least one adjustable valve in fluid communication with the at least one liquid-to-liquid heat exchanger for controlling flow of facility coolant through the at least one liquid-to-liquid heat exchanger, and a controller controlling the at least one adjustable valve based on a sensed temperature of the system coolant.

14. The data center of claim 11, wherein the at least one heat exchange assembly comprises at least one liquid-to-liquid heat exchanger across which heat is transferred from the system coolant to the facility coolant, and wherein the power and cooling apparatus further comprises at least one modular cooling unit coupled in fluid communication with at least one system coolant loop, the at least one system coolant loop facilitating transfer of system coolant between the at least one liquid-to-liquid heat exchanger and the at least one electronics rack, each modular cooling unit of the at least one modular cooling unit comprising a system coolant pump and a system coolant reservoir, the system coolant pump facilitating circulation of system coolant within the at least one system coolant loop between the at least one liquid-to-liquid heat exchanger and the at least one electronics rack.

15. The data center of claim 14, wherein the at least one bulk power assembly is electrically connected to power the at least one system coolant pump of the at least one modular cooling unit.

16. The data center of claim 11, wherein the power and cooling apparatus further comprises at least one thermostat in thermal contact with at least one heat-generating component of the at least one bulk power assembly, the at least one thermostat being configured and disposed to automatically adjust facility coolant flow through the at least one facility coolant sub-loop based on a temperature of the at least one heat-generating component.

17. The data center of claim 16, wherein the power and cooling apparatus further comprises at least one cold plate coupled to the at least one heat-generating component of the at least one hulk power assembly, the at least one facility coolant sub-loop being in thermal contact with the at least one cold plate.

18. The data center of claim 17, wherein the power and cooling apparatus further comprises a facility coolant supply manifold and a facility coolant return manifold coupled to facilitate flow of facility coolant in parallel to the at least one heat exchange assembly and the at least one bulk power assembly.

* * * * *